United States Patent
Kobatake

[11] Patent Number: 6,046,941
[45] Date of Patent: Apr. 4, 2000

[54] NON-VOLATILE SEMICONDUCTOR MEMORY DEVICE

[75] Inventor: Hiroyuki Kobatake, Tokyo, Japan

[73] Assignee: NEC Corporation, Tokyo, Japan

[21] Appl. No.: 09/081,072

[22] Filed: May 19, 1998

[30] Foreign Application Priority Data

May 20, 1997  [JP]  Japan ................................. 9-129999

[51] Int. Cl.[7] .............................. G11C 7/00; G11C 11/00
[52] U.S. Cl. ...................... 365/189.05; 365/154; 365/156
[58] Field of Search .................... 365/154, 156, 365/189.05, 185.08, 185.09, 185.11, 185.29, 218, 185.17, 185.25

[56] References Cited

U.S. PATENT DOCUMENTS

| | | | |
|---|---|---|---|
| 4,980,859 | 12/1990 | Guterman et al. | 365/185.08 |
| 5,204,839 | 4/1993 | Lee et al. | 365/204 |
| 5,313,420 | 5/1994 | Masuoka | 365/218 |
| 5,353,251 | 10/1994 | Uratani et al. | 365/154 |
| 5,452,251 | 9/1995 | Akaogi | 365/218 |
| 5,521,864 | 5/1996 | Kobayashi et al. | 365/185.29 |
| 5,703,820 | 12/1997 | Kohno | 365/185.25 |
| 5,768,208 | 6/1998 | Bruwer et al. | 365/185.08 |
| 5,818,761 | 10/1998 | Onakado et al. | 365/185.11 |
| 5,877,979 | 3/1999 | Li et al. | 365/154 |

FOREIGN PATENT DOCUMENTS

| | | |
|---|---|---|
| 0 459 794 | 12/1991 | European Pat. Off. . |
| 5-159586 | 6/1993 | Japan . |

*Primary Examiner*—Trong Phan
*Attorney, Agent, or Firm*—Sughrue, Mion, Zinn Macpeak & Seas, PLLC

[57] ABSTRACT

A semiconductor memory device of the present invention has a write circuit and bit line coupled to the write circuit. Output from the write circuit is sent to corresponding bit line by a transfer gate. During data write term, a write voltage is applied to the bit line when writing a "0" and zero volts is applied to the bit line when writing a "1". The bit line therefore is not left in a floating state when writing either a "0" or a "1". A rise in voltage potential of a bit line due to noise is prevented from occurring, thereby eliminating data writing errors.

5 Claims, 10 Drawing Sheets

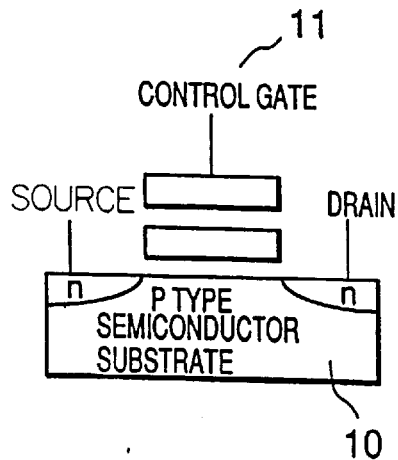
Fig. 11A PRIOR ART
Fig. 11B PRIOR ART
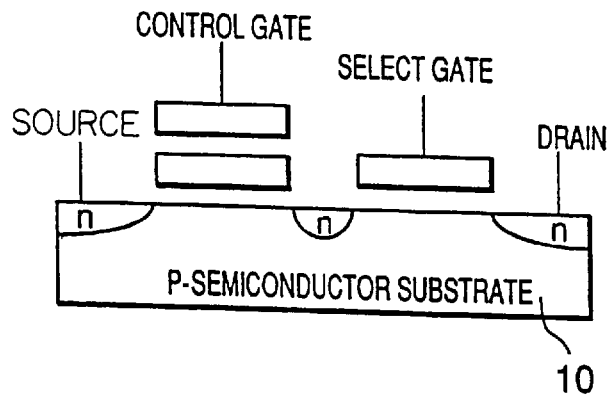
Fig. 12A PRIOR ART
Fig. 12B PRIOR ART

NON-VOLATILE SEMICONDUCTOR MEMORY DEVICE

BACKGROUND OF THE INVENTION

1. Field of the Invention

This invention relates to a semiconductor memory device and in particular, to a non-volatile semiconductor memory device capable of simultaneous writing of a plurality of bytes.

2. The Related Art

A non-volatile semiconductor memory device for simultaneous writing of a plurality of bytes, as disclosed in Japanese Laid-open Patent No. Hei 5-159586, is shown in FIG. 8. The memory device comprises a memory cell array 1 which includes writable and erasable memory cells M00–M33 arranged in rows and columns in a matrix. A plurality of bit lines BL0–BL3 are connected to the drains of the memory cells arranged in rows corresponding to memory cells M00–M33. The memory cell array 1 contain a plurality of word lines WL0–WL3 connected to the control gates of the memory cells arranged in lines corresponding to memory cells M00–M33. A Y decoder 2 decodes the address signal to select one of bit lines BL0–BL3. A Y selector 3 comprises N channel MOS transistors NY0–NY3 whose gates are input with the output of the Y decoder 2 installed to correspond to the bit lines BL0–BL3. An X decoder 4 decodes the address signal to select one of word lines WL0–WL3. A sense amplifier 5 reads out the data stored in the memory cells selected with the Y decoder 2, the Y selector 3 and the X decoder 4. Write circuits LA0–LA3 each include a respective latch for latching data from a data line 6 and outputting a write voltage to write data on the memory cells based on data input from the latches.

As shown in FIG. 9, the write circuits LA0–LA3 are each comprised of a transfer gate, made up of an N channel MOS transistor 2, which is connected between a latch 7 and the data line 6 and which is responsive to the address Y. The latch 7 comprises a transfer gate made up of inverters 64 and 65, an N channel MOS transistor 53 and a P channel MOS transistor 54 for feedback when the latch signal DL is LOW. The latch 7 also comprises a transfer gate made up of an N channel MOS transistor 51 and a P channel MOS transistor 52 for conducting when the latch signal DL is HIGH. The write circuits LA0–LA3 are comprised of a transfer gate made up of N channel MOS transistor 55 and a P channel MOS transistor 56 for conducting when the write signal PRO is HIGH. The write circuits also include an inverter comprised of an N channel MOS transistor 59 and a P channel MOS transistor 58 connected serially between ground voltage (GND) and a program high voltage power supply Vpp wherein the inverter inputs the output from the transfer gate controlled by the write signal PRO. Additionally the write circuits include a P channel MOS transistor 57 connected at its source to the power supply Vpp, at its gate to the output of the inverter, and at its drain to the input of the inverter. An N channel MOS transistor 60 is also included in the write circuits to pull down the input of the inverter when the write signal PRO0 is LOW. The write circuits also include an N channel MOS transistor 61 whose source is connected to the bit line BL, whose gate is connected to the output of the inverter, and whose drain is supplied with a voltage VH to write the necessary data on the memory cell.

FIG. 11A show an example of a memory cell according to FIG. 8 and FIG. 11B show operation methods for erasing, writing and reading of the memory cell. To effect erasure in the memory cell, for instance, the voltage shown in FIG. 11B is applied, thereby causing electrons to be injected into a floating gate 11 from a p channel substrate 10 by means of the F-N tunnel mechanism so that the memory cell threshold voltage shifts to a high value (for instance 6 volts). However during write, the electrons are pulled from the floating gate 11 to the p channel substrate 10 by means of the F-N tunnel mechanism so that the memory cell threshold voltage shifts to a low value (for instance 1 volt).

The write operation of the non-volatile semiconductor memory device of the prior art is explained by using FIG. 10. During the data read, the address Y corresponding to the latches LA0–LA3 are selected in succession, data corresponding to the selected address is applied to the data input line and data is set in the respective latches. At the same time, the input of the inverter comprised of P channel MOS transistor 58 and N channel MOS transistor 59 is pulled down to zero volts with the write signal PRO0 at HIGH so that the output sets to high (Vpp) and the N channel MOS transistor 61 turns on. Further, switching the write voltage VH to zero volts, initializes the bit lines BL0–BL3 setting a voltage potential of zero volts.

In initializing the bit line to zero volts, when the previous writing has been performed and the bit is held at a high potential (for instance 5 volts) as shown by the broken line in FIG. 10, the high potential (for instance 5 volts) is maintained even during the write interval and the memory cells (M01, M03) on which writing are not being performed are also set to write status so that writing errors are prevented. These writing errors are particularly prone to occur in memory cells written by the F-N tunnel mechanism at an extremely low write current (for instance 1 pico ampere).

Next, during data writing, the write signal PRO0 changes from HIGH level to LOW level and the signal PRO changes from LOW level to HIGH level. Further, the voltage VH changes from a low voltage to high voltage (e.g., 5 V). Therefore, each voltage corresponding to the data for each bit lines (in this example BL0=BL2=5 volts, BL1=BL3=0 volts) is applied to the respective bit lines, the target data is written by the F-N tunnel mechanism with −10 volts applied to the word lines (in this example WL0) selected by the X decoder 4 and a zero volt bias applied to the other non-selected word lines (in this example WL1 to WL3). In the example here, the threshold voltage for memory cells M00 and M02 shifts to a low value (for instance 1 volt) and the threshold voltage for memory cells M01 and M03 is maintained at a high value (for instance 6 volts) in erase status.

As shown in the prior art in FIG. 9, the gate of the transistor 61 is driven by the output signal from the latch 7 and a high voltage VH is applied to the bit line when the N channel MOS transistor 61 turn on because the data "1" is written in the latch 7. That is, when the N channel MOS transistor 61 turns off because the data "0" is latched in the latch 7, the bit lines are in a floating state, with the voltage potential of the initialized bit lines maintained at a voltage of zero volts. In such cases, since the bit lines are in a floating state, when the bit line voltage potential rises due to noise as for instance shown by the phantom lines of the bit line BL1 in FIG. 10, the prior art has the drawback that a "0" was written by mistake since a high voltage was maintained due to the extremely low write current.

Another problem in the prior art is the initialization interval needed for changing the bit line to zero volts as shown in FIG. 10. Here, the write voltage VH must be changed from the original voltage (for instance 5 volts) to a voltage of zero volts for initialization. This step requires providing a circuit to switch write voltages and voltages for performing initialization.

SUMMARY OF THE INVENTION

It is therefore an object of this invention to provide a non-volatile semiconductor memory device having stable program operation without writing mistakes.

A semiconductor memory device of the present invention includes a memory cell capable of being written to, a bit line coupled to the memory cell, and a write circuit having a latch circuit for latching write data and conveying a voltage corresponding to the write data in the latch circuit to the bit line during a data write term regardless which data (high or low) is to be written to the memory cell.

Further, an output from the write circuit is connected to the bit line by a transfer gate.

Accordingly, during the data write term (cycle) a write voltage VH is applied to the bit lines when writing a "0" and zero volts is applied to the bit lines when writing a "1". These bit lines are not left in a floating state when writing either a "0" or a "1", so where even when writing a memory cell with an F-N tunnel mechanism where the write current is extremely small (for instance about 1 picoampere), voltage potential of bit lines does not rise due to noise and writing errors do not occur.

Further, since zero volts is applied to the bit lines by way of the transfer gates when writing a "1" there is no need to reset the bit line to zero volts. Therefore there is no need to change between a write voltage and an initializing voltage.

BRIEF DESCRIPTION OF THE DRAWINGS

The above and other objects, advantages and features of the present invention will be more apparent from the following description taken in conjunction with the accompanying drawings, in which:

FIG. 11A shows the structure of a (conventional) non-volatile semiconductor memory cell and FIG. 11B is a table showing the various MOS transistor erase, write and read-out voltages corresponding to the structure shown in FIG. 11A.

FIG. 12A is a drawing showing the structure of another (conventional) non-volatile semiconductor memory cell and FIG. 12B is a table showing the transistor erase, write and read-out voltages corresponding to the structure shown in FIG. 12A.

DETAILED DESCRIPTION OF THE PREFERRED EMBODIMENTS

Figure 1:
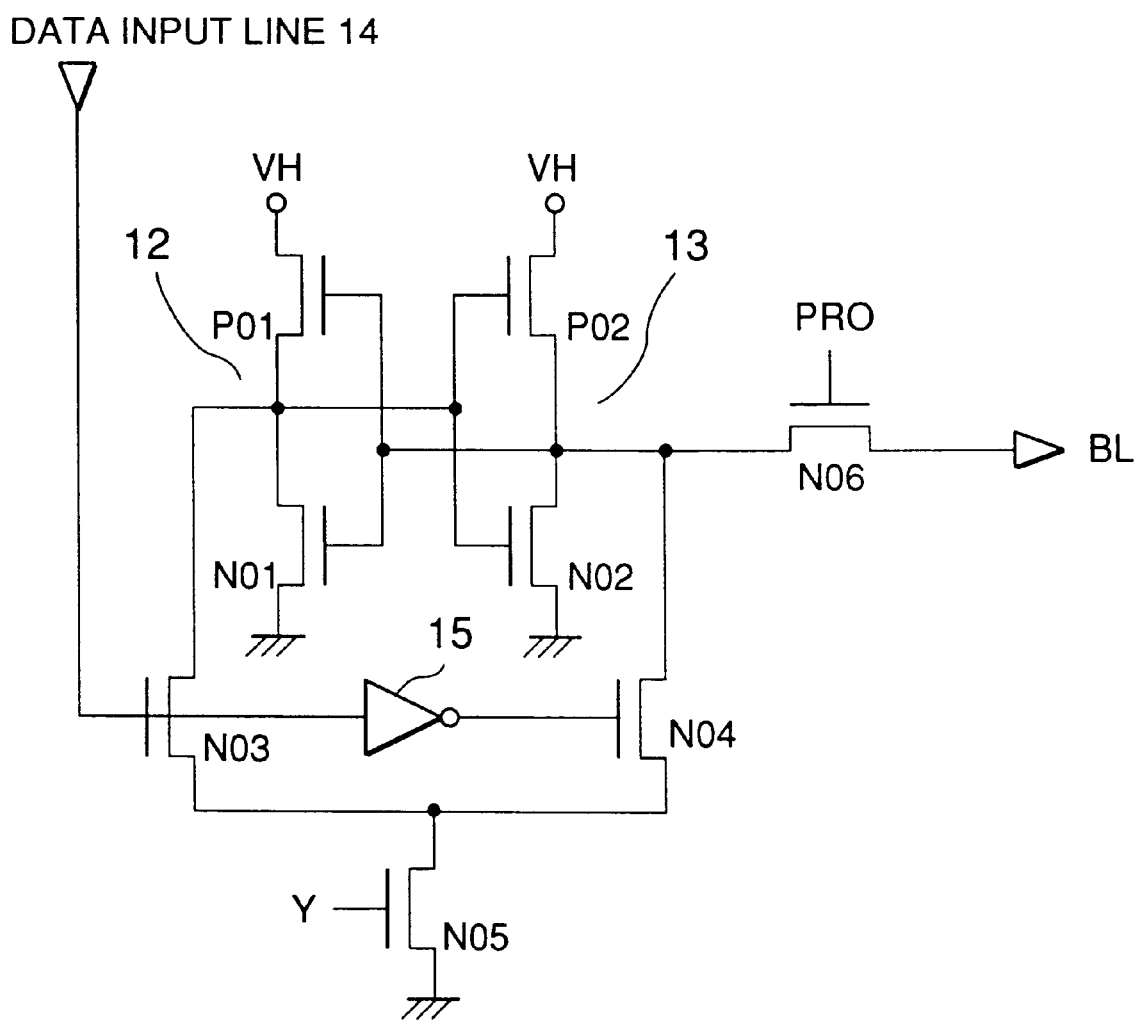
FIG. 1 is a circuit diagram showing the latches and transfer gates utilized in the non-volatile semiconductor memory device of a first embodiment of the present invention.
Figure 8:
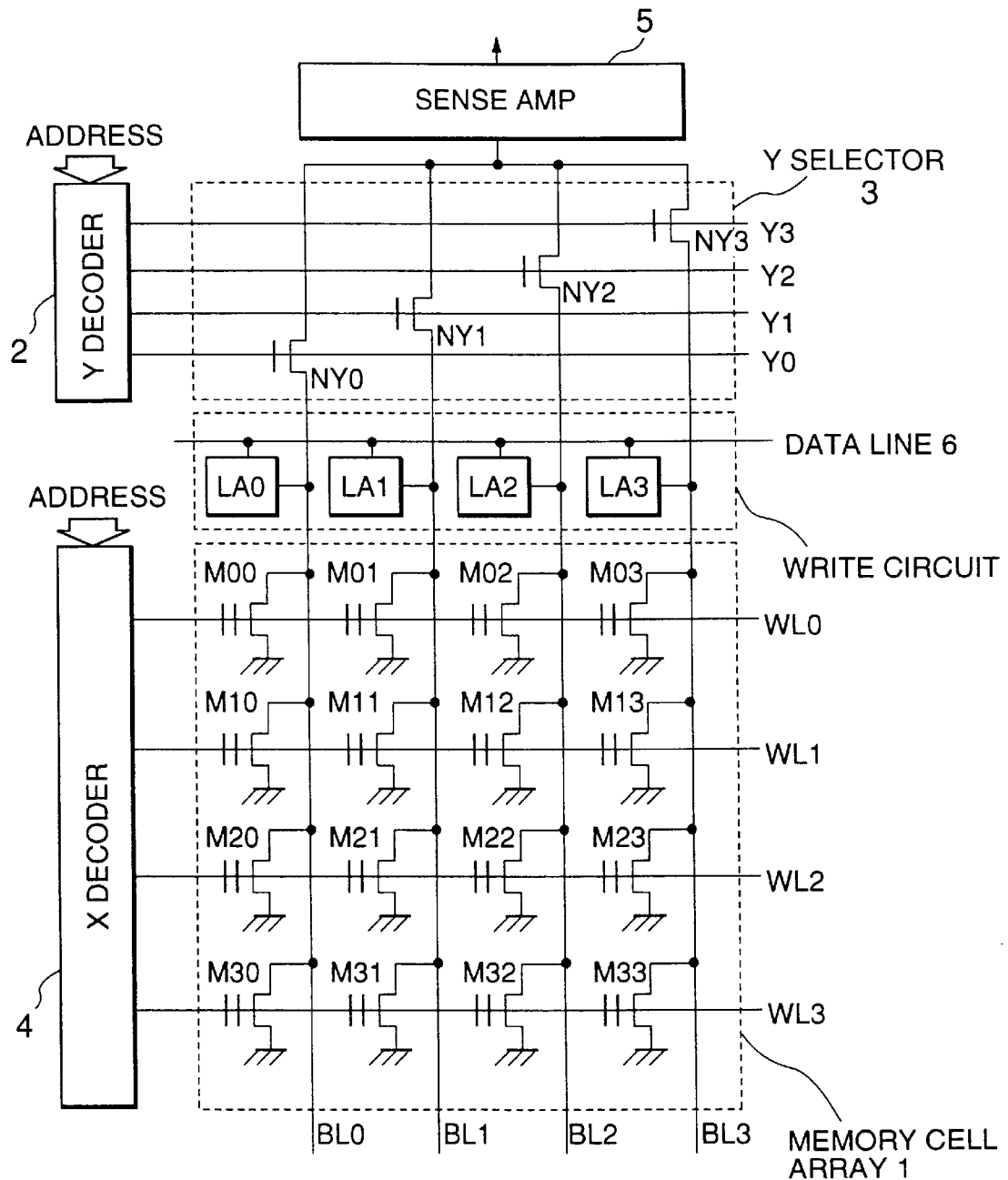
FIG. 8 is a circuit block diagram showing a general (conventional) non-volatile semiconductor memory device.
Figure 9:
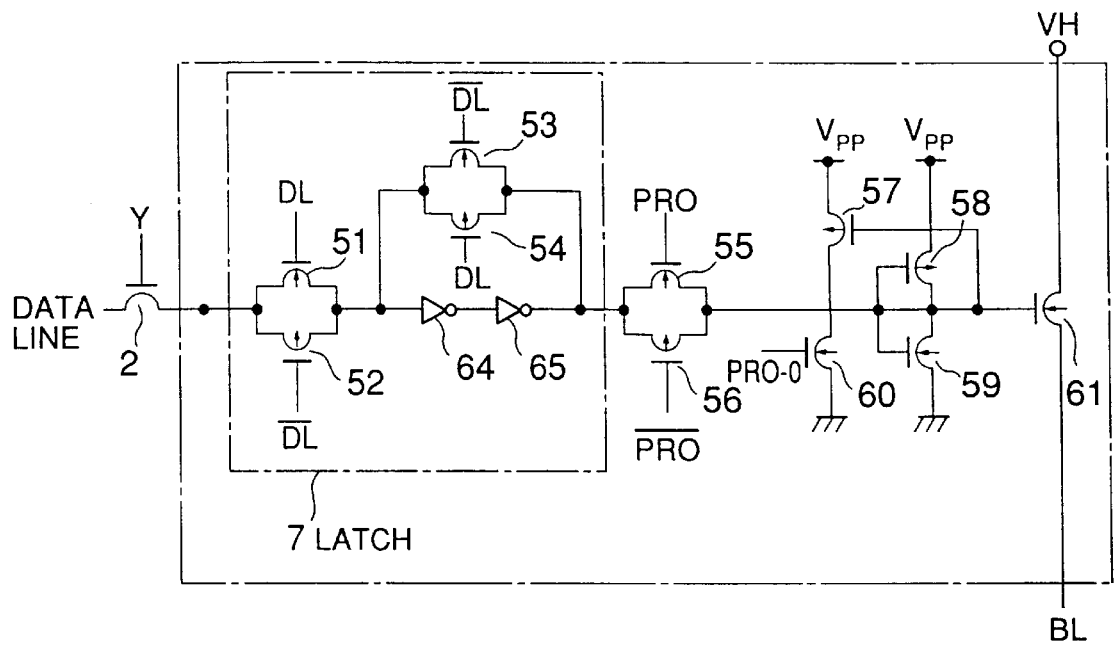
FIG. 9 is a circuit block diagram showing the write circuit utilized in a prior art non-volatile semiconductor memory device.
Figure 10:
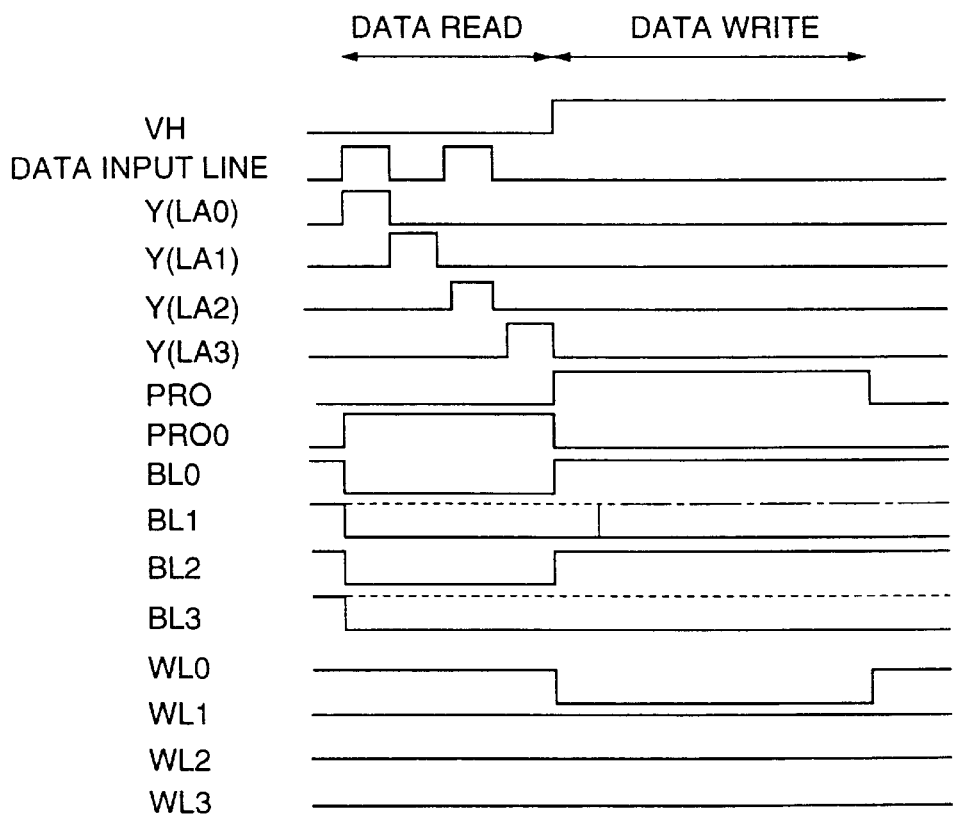
FIG. 10 is a timing diagram showing the writing operation of a prior art non-volatile semiconductor memory device.

A first embodiment of the present invention is explained by FIGS. 1, 2, and 8. Since the structure of the semiconductor memory device used with the first embodiment of the present invention is consistent with that shown by FIG. 8, the explanation is omitted.

FIG. 1 shows write circuits LA0–LA3 utilized in the non-volatile semiconductor memory device of the first embodiment of the present invention.

One of latches LA0–LA3 of the write circuit of the first embodiment comprise a first inverter 12 made up of a P channel MOS transistor P01 and an N channel MOS transistor N01 between the write voltage VH and the ground (GND), and a second inverter 13 made up of a P channel MOS transistor P02 and an N channel MOS transistor N02. The output of the first inverter 12 connects to the input of the second inverter 13, and the output of the second inverter 13 connects to the input of the first inverter 12.

Further, the transfer gate of the write circuit of the first embodiment comprises an N channel MOS transistor N03, with its drain connected to the output of the first inverter 12 and its gate connected to the data input line 14, and an N channel MOS transistor N04, with its drain connected to the output of the second inverter 13 and whose gate is supplied by an inverter 15 with an inverted version of the signal from the data input line 14. An N channel MOS transistor N05, with its source connected to GND and its drain connected to the sources of N channel MOS transistors N03 and N04, receives the address Y at its gate. An N channel MOS transistor N06 is connected between the output of the second inverter 13 and the bit line BL, with its gate fed with a write (program) signal PRO.

Next, the operation is explained for example by means of the memory cells M00–M33 in FIGS. 11A and 11B, and FIG. 8.

Figure 2A:
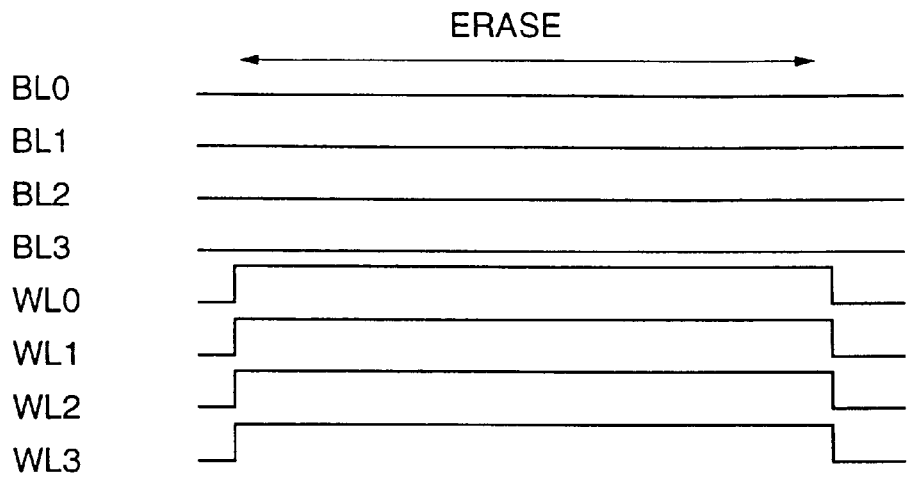
FIGS. 2A and 2B are timing charts showing the operation of the embodiment of FIG. 1.

In the erase period, as shown in FIG. 2A, all of the word lines WL0–WL3 are set to a high value by the X decoder 4 in FIG. 8 (for instance 18 volts) and the bit line BL0–BL3 are set to a floating state so that the threshold voltage of the memory cells M00–M33 shifts to a high value (for instance 6 volts) and the data is erased.

Figure 2B:
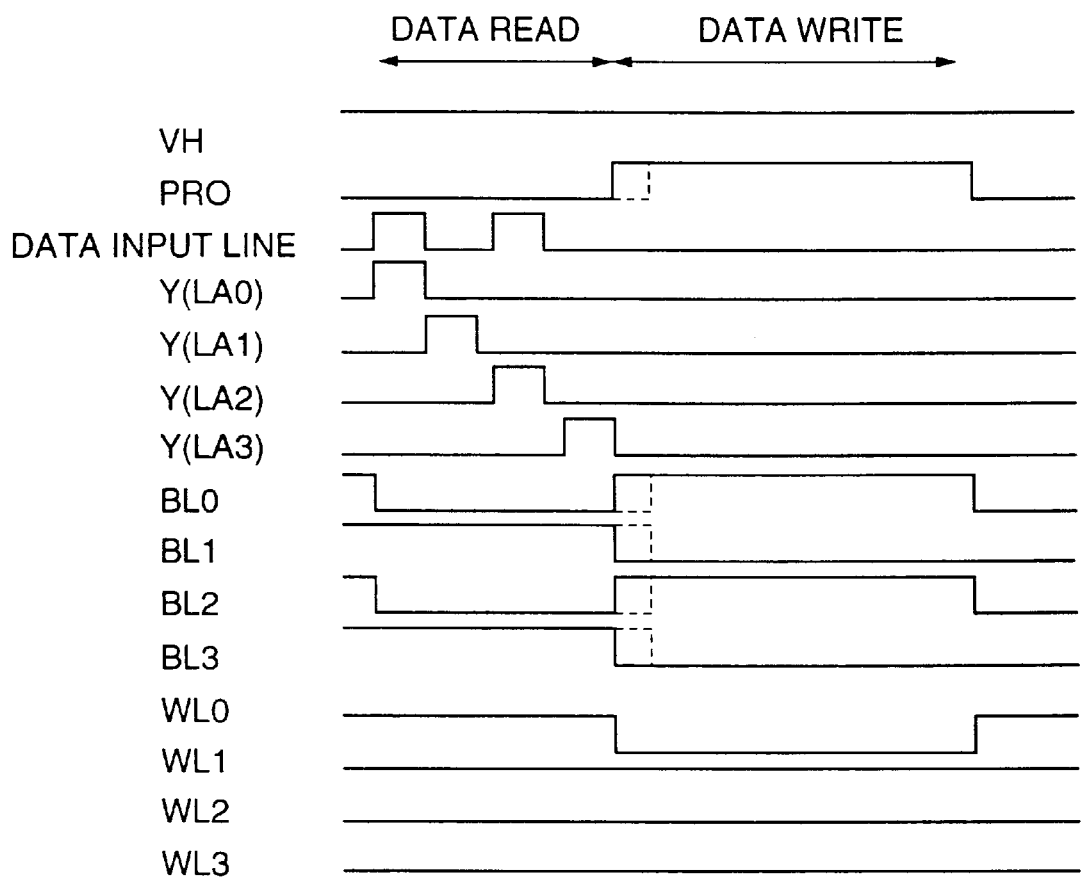

In write operation period, as shown in FIG. 2B during the data read term when the address Y corresponding to the latch LA0–LA3 in FIG. 8 are selected in succession, data corresponding to the selected address is applied to the data input line 14 to set data in the respective latches. Accordingly, the N channel MOS transistor N05 turns on at the same time as the N channel MOS transistor N03 turns on in response to data from the data input line 14, the output of the first inverter 12 is pulled down to ground potential, or the N channel MOS transistor N04 turns on to set the output of the second inverter 13 at the ground potential so that the desired data is set in each latch.

Next, during data write term, (period or cycle) the write signal PRO changes from LOW level to HIGH level, a voltage corresponding to data latched at the respective write circuits LA0–LA3 is applied to the respective bit lines in FIG. 8 (in this example BL0=BL2=5 volts, BL1=BL3=0 volts) and the data is written at 10 volts to the respective memory cells M00–03 corresponding to the word line (in this example WL0) selected by the X decoder 4 and the other non-selected (for example, zero volt) word lines (in this example WL1 to WL3) so that the desired data is written by the F-N tunnel mechanism. In the example here, the threshold voltage for memory cells M00 and M02 shifts to a low value (for instance 1 volt) and the threshold voltage for memory cells M01 and M03 is maintained at a high value (for instance 6 volts) in erase status.

When the write signal PRO is a HIGH level, the transfer gate N06 turns on, the output of the latch and the bit line BL are connected and each bit line set with the desired data so that, for instance, even if data is being held in the data lines from the time of the previous data writing, the correct voltage level corresponding to the respective data will be set in each bit line as shown in FIG. 2B.

Therefore, there is no need to reset each bit line, and switching voltages to reset the write voltage VH are unnecessary. Further, because the transfer gate N06 turns on during the data write period so that the latch output is connected to the bit line BL, the bit line will not be in a floating state and even if noise is applied in the circuit, the bit line voltage will not fluctuate and writing mistakes will not occur.

During readout term, the desired N channel MOS transistor comprising the Y selector 3 turns on by the Y decoder 2 to connect the selected bit line with the sensing amplifier 5. The word line selected by the X decoder 4 is biased to for instance three volts and the other non-selected lines are biased to zero volts so that when a memory cell written with a low threshold voltage (for instance 1 volt) is selected, the memory cell conducts current to read a "0" for instance. A memory cell selected having a high threshold voltage (for instance 6 volts) does not, however, conduct current so that, for instance, a "1" is read out from the sensing amplifier 5.

Figure 3:
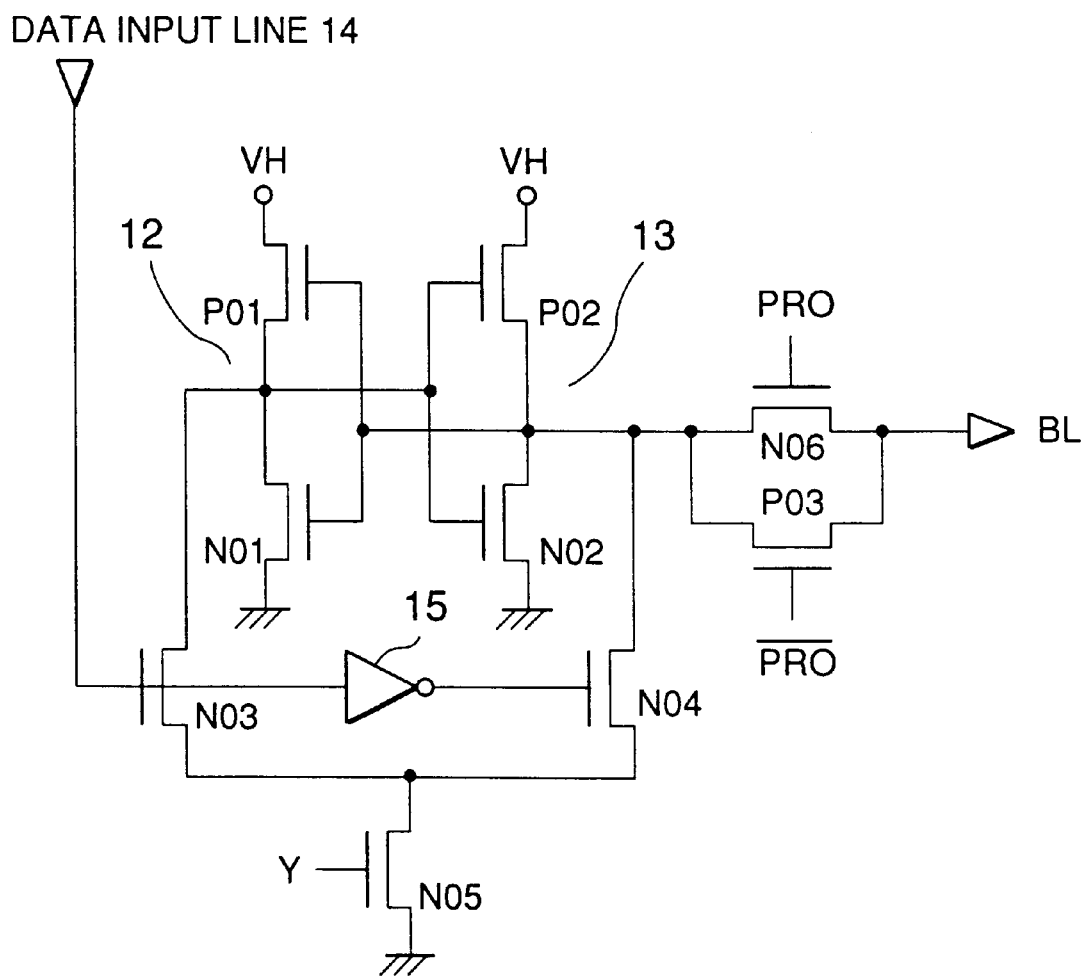
FIG. 3 is a circuit diagram showing a second embodiment of the invention.

FIG. 3 is a circuit diagram showing the latches and transfer gates of the write circuits LA0–LA3 utilized in the non-volatile semiconductor memory device of the second embodiment of the present invention.

The circuit shown in FIG. 3 includes a P channel MOS transistor P03, which is connected in parallel with the N06 transistor of the first embodiment (see FIG. 1), is supplied with a PRO_B signal which is an inverted PRO signal.

In the latch in FIG. 1, a write signal PRO with a high level having a voltage of "VH+N16 threshold voltage" or larger (for instance 7 volts) is required in order to send the desired write voltage (VH: for instance 5 volts or 0 volts) to the bit line BL by means of the transfer gate so that, providing of for instance, an additional 7 volt power supply is necessary. The structure of the second embodiment shown in FIG. 3 however can send a desired voltage (VH or zero volt) to the bit line because the transistor P03 does not produce the voltage drop of the voltage VH due to its threshold, because a low level inverted write signal PRO_B (as zero volts) is supplied to the gate of the transistor P03 so that another power supply (for instance of seven volts) is not necessary.

Other sections are the same as the latch in the first embodiment of this invention as shown in FIG. 1 and have the same reference numerals so their explanation is omitted here.

Figure 4:
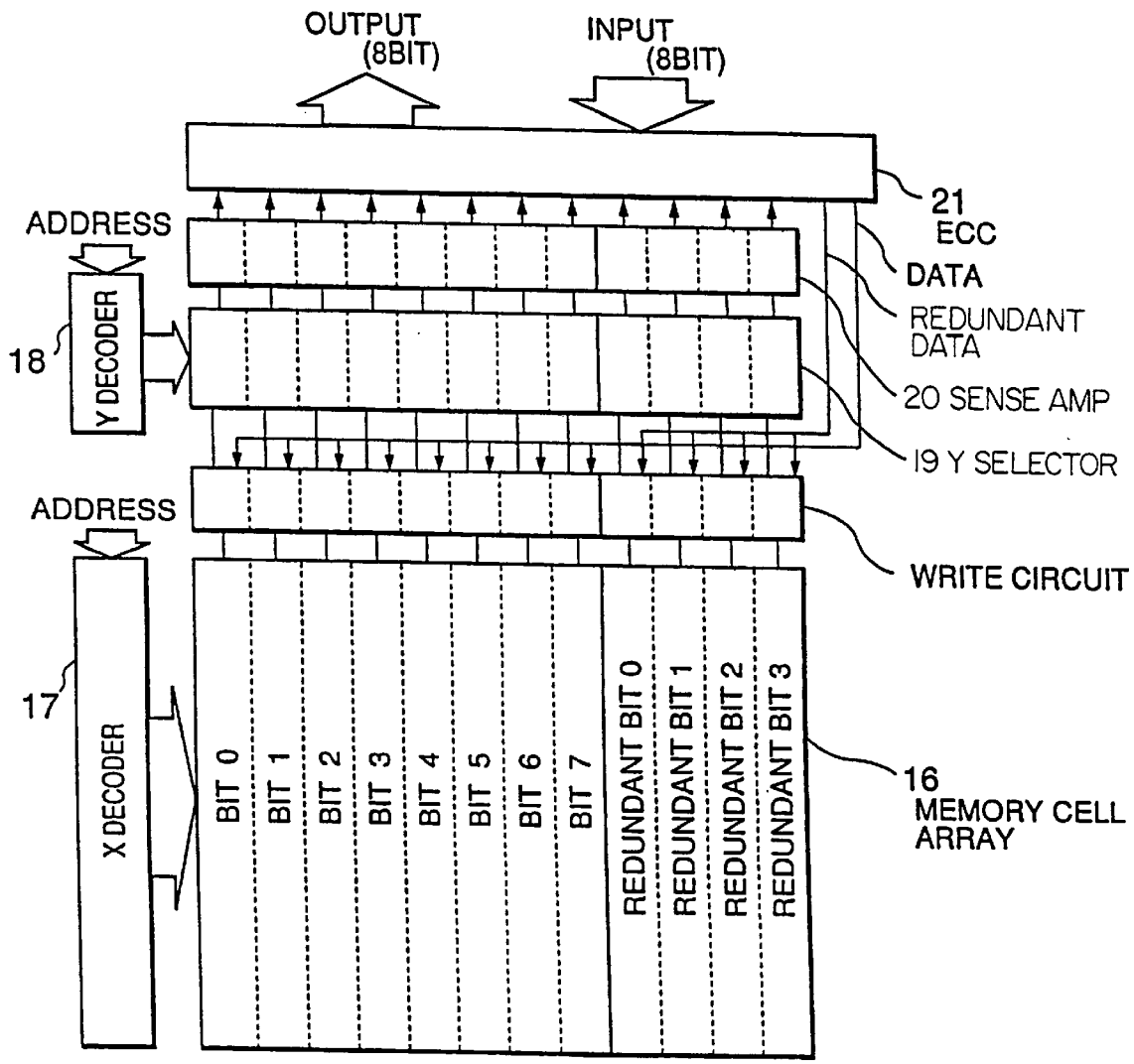
FIG. 4 is a circuit diagram showing a third embodiment of the invention.

FIG. 4 is a block diagram showing the third embodiment of this invention. An ECC (error correcting circuit) is installed in the non-volatile semiconductor memory device so that even if a portion of the stored data is lost or damaged the correct data can be restored for the write circuits containing the latches shown in FIG. 1 and FIG. 3.

A means for improving the reliability by installing an ECC (error correcting circuit) in the non-volatile semiconductor memory device is described in Japanese Laid-Open Patent No. Hei 8-31196. As shown for instance in FIG. 4, the memory device is comprised of a memory cell array 16 made up of memory cell blocks for bit 0 through bit 7 and memory cell blocks for redundant bit 0 through bit 3 to store redundant data for correcting error bit data, an X decoder 17 for selecting the desired memory cell from within the memory cell array 16, a Y decoder 18 and Y selector 19, and a sense amplifier 20 for readout of the data stored in the selected memory cell. The error correcting circuit ECC 21 generates 4 bit redundant data from the 8 bit write data and if errors are present in the 12 bit data including redundant bits read out from the sensing amplifier 20, the ECC 21 then issues correct 8 bit data.

The write circuit in FIG. 4 contains a plurality of latches, according to those shown in either FIG. 1 or FIG. 3, and 8 bit write data is applied by way of the data lines to the latches corresponding to bit 0 through bit 7. The 4 bit redundant data generated in the ECC 21 is applied by way of the redundant data lines to the latches corresponding to the redundant bits 0 through bit 3. As explained in FIG. 2B, the write data and the redundant data are written on the corresponding latches selected in succession by the address Y.

The third embodiment of this invention shown in FIG. 4, since writing errors due to the effect of noise do not occur and coupled with use of the data correcting function provided by the ECC 21, provides a non-volatile semiconductor memory device of extremely high reliability.

Figure 5:
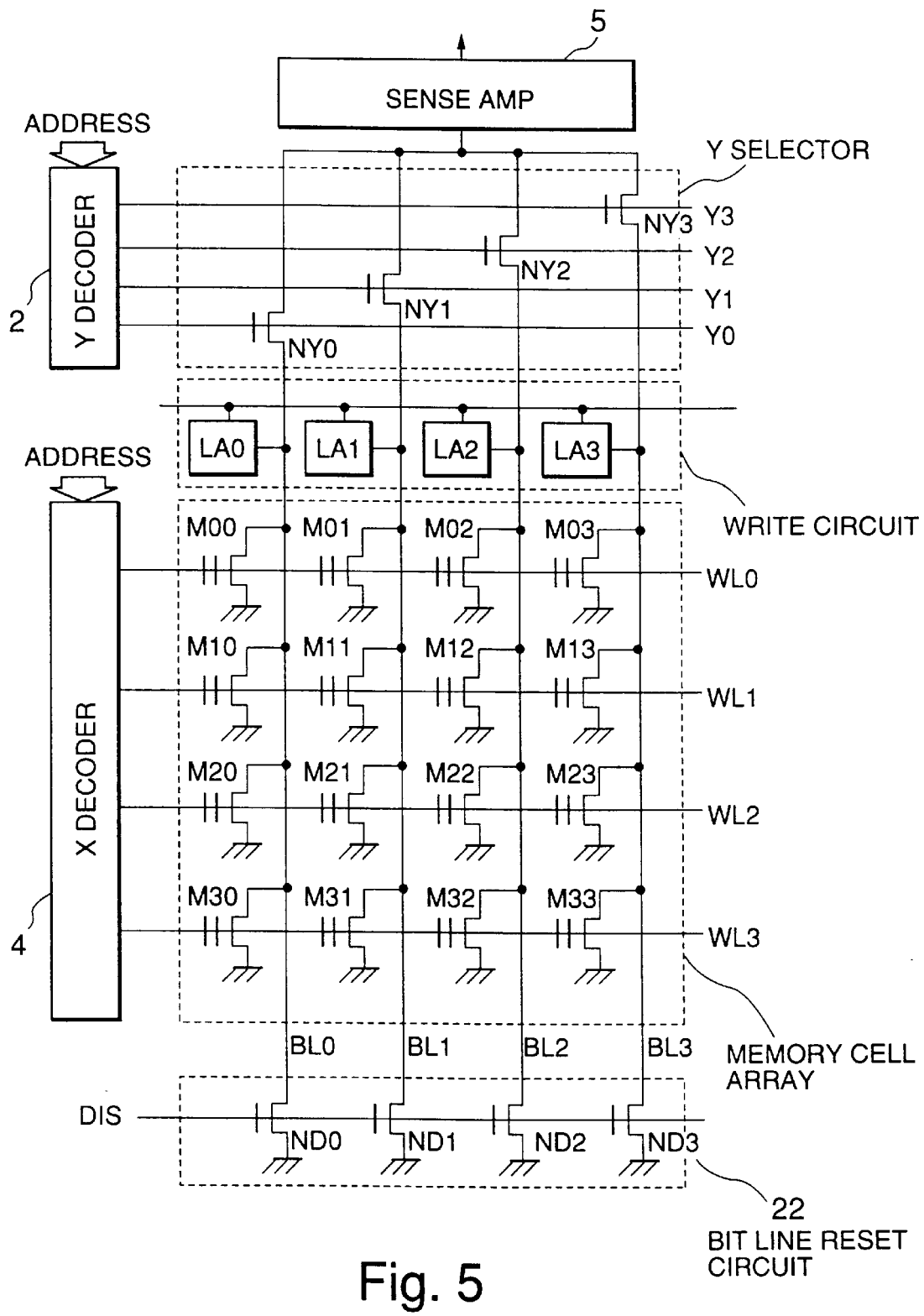
FIG. 5 is a circuit diagram showing a fourth embodiment of the invention.

FIG. 5 is a block circuit diagram showing the fourth embodiment of this invention. This embodiment comprises a bit line reset circuit 22 made up of N channel MOS transistors ND0 through ND3 supplied at their gates with a discharge signal DIS and connected to ground (GND) through their sources. The other sections are the same as in the first embodiment of this invention shown in FIG. 1 and have the same reference numerals so their explanation is omitted here.

Figure 6:
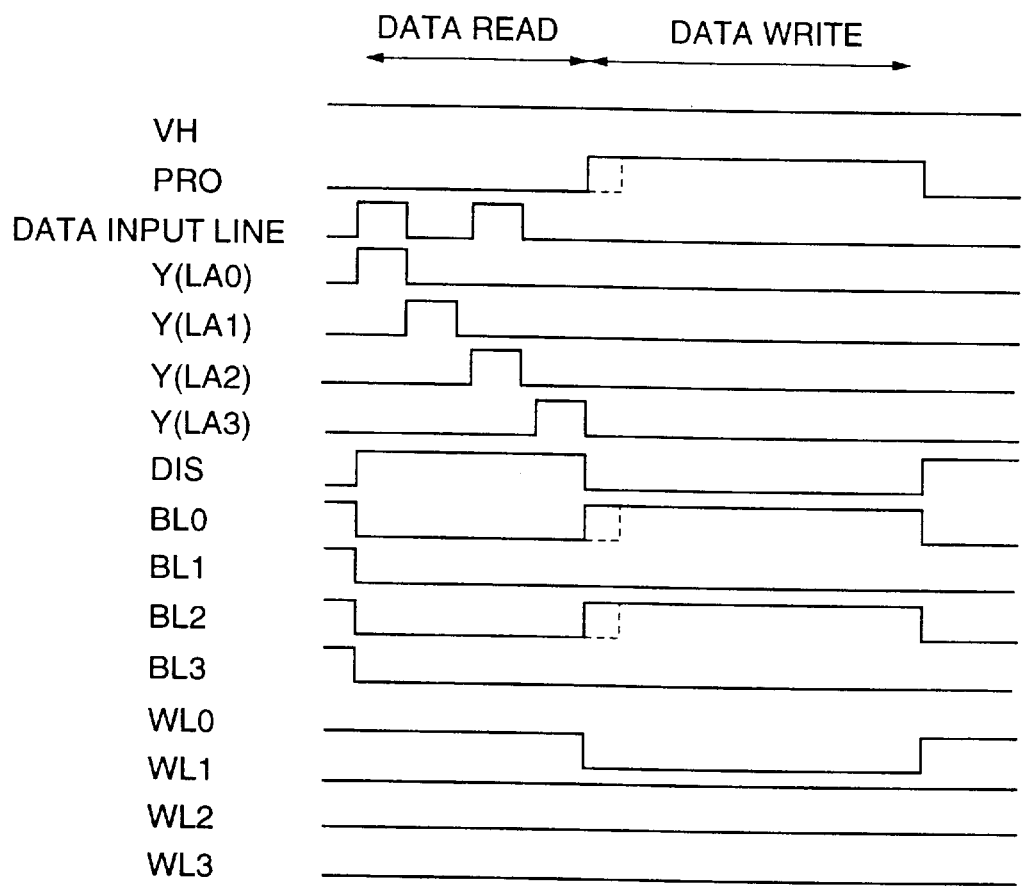
FIG. 6 is a circuit diagram showing a fifth embodiment of the invention.

The write operation is next explained while referring to FIG. 6. During the data read period, the N channel MOS transistors ND0 through ND3 comprising the bit reset circuit 22 are turned on by the discharge signal DIS setting to high, to reset the bit lines BL0 through BL3 to zero volt. During the data write period, the bit lines BL0 through BL3 are set to the voltages matching the write data.

When there is no bit reset circuit 22, if the write signal PRO is a delayed somewhat, as represented by the broken lines in FIG. 2B, the voltage for the word lines is first set (in this example −10 volts is set in word line WL0) and then a voltage shown by the dashed lines is set in the bit lines BL0 through BL3. The selected cells (control gates are biased at −10 volts, for memory cells M01 through M03 in this example) connected to the bit lines BL0 through BL3 are written along with this delay period so that write errors are prone to occur and cause problems.

However, when a bit line reset circuit 22 is added as shown in FIG. 5, and the bit lines BL0 through BL3 are reset to zero volts prior to the data write term. Even if, as shown in FIG. 6, the write signal PRO is delayed, the delay responds to only the bit lines applying the write voltage (in this example, bit lines BL0 and BL2) and bit lines connected to memory cells where writing is not performed (in this example, bit lines BL1 and BL3) continue to maintain a zero volt level so that writing errors will not occur. That is, even if the write signal PRO is delayed, the memory cells corresponding to the selected word line do not come into write state because the drain of each memory cells is supplied with 0 V (is not supplied with 5 V, see FIG. 11B).

The fourth embodiment of this invention therefore provides a non-volatile semiconductor memory device not only having a circuit for accurate control signal timing of the X decoder 4 and the write circuits LA0 through LA3 but also having high reliability.

Figure 7:
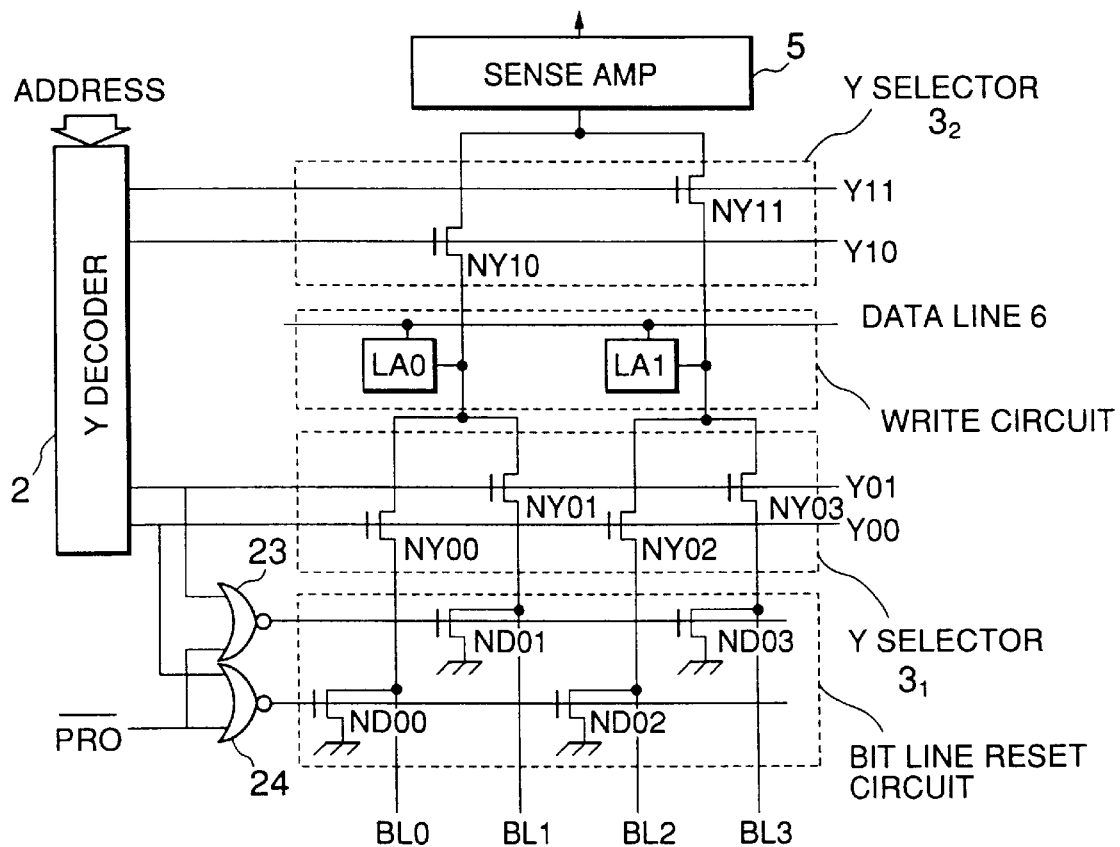
FIG. 7 is a circuit diagram showing a sixth embodiment of the invention.

FIG. 7 is a block diagram showing the fifth embodiment of the present invention. The sense amplifier and bit lines are connected to the bit lines BL0 through BL3 by way of two stages: the Y selector $3_1$ and the Y selector $3_2$. The output of the write circuits LA0 and LA1 with a circuit configuration shown in FIG. 1 or FIG. 3 connect to the output of the Y selector $3_1$ by way of the transfer gates. A bit line reset circuit 22 comprised of the N channel MOS transistors ND01 through ND03 connected to each of the corresponding bit lines.

The Y selector $3_1$ is comprised of the N channel MOS transistors NY00 and NY02 supplied at their gates with the output of the Y decoder Y00 and also comprised of N channel MOS transistors NY01 and NY03 supplied at their gates with the output of the Y decoder Y01. The Y selector 32 is comprised of the N channel MOS transistor NY10 supplied at the gate with the output of the Y decoder Y10 and also comprised of the N channel MOS transistors Y11 supplied at the gate with the output of the Y decoder Y11. The N channel MOS transistors ND00 and ND02, comprising the bit line reset circuit 22, are fed at their gates with a signal from the Y decoder output Y00 inverted by the NOR gate 24. The gates of the N channel MOS transistors ND01 and ND03 are supplied with the Y decoder output Y01 each inverted by the NOR gate 23. The other input of the NOR gates 23 and 24 are supplied with write signal PRO_B (inverted PRO). The N channel MOS transistors ND00 and N03 turn off at times other than the data write term (period a cycle).

In the data write term in FIG. 7, the output of the write circuits LA0 and LA1 is sent to the bit lines selected by the Y selector $3_1$ and when for instance the Y00 is selected by the Y decoder 2, the N channel MOS transistors NY00 and NY02 turn on and the output of the NOR gate 24 simultaneously goes low so that the N channel MOS transistors ND00 and ND02 turn off and the output of the write circuit LA0 is sent to the bit line BL0 and the output of the write circuit LA1 is sent to the bit line BL2. The bit lines BL1 and BL3 on the other hand are in a non-select status at the output of the Y decoder Y01 so that the N channel MOS transistors NY01 and NY03 turn off and the bit lines are set to a floating state, and since the output of the NOR gate 23 sets to high level, the N channel MOS transistors ND01 and ND03 turn on and the bit lines are set to ground voltage potential.

Accordingly, in the configuration of the fifth embodiment, the number of the latches can decrease and all of the bit lines are reset.

In FIG. 7 the memory cell array and X decoder have been omitted but otherwise the explanation is the same as for FIG. 1.

Configured as described above, since the transfer gates are on and the latch outputs are connected to the bit lines during the data write term, the bit lines do not reach a floating state and even if noise is present in the circuit, the bit line voltage level do not fluctuate, thus preventing writing errors from occurring and providing a non-volatile semiconductor memory device with stable write operation.

It is apparent from the specification that the present invention is not limited to the above embodiments but may be modified and changed without departing from the scope and spirit of the invention. For, example, the explanation of the embodiments of the invention utilized the memory cell in FIG. 11 for an explanation however memory cells having a select gate as shown in FIG. 12 or other suitable non-volatile semiconductor memory cells can clearly be utilized to obtain the same effects described above so the memory cells of this invention need not be limited to the memory cell shown in FIG. 11.

What is claimed is:

1. A write circuit used in a semiconductor memory device, said write circuit comprising:
   a latch circuit for latching write data from a data input line; and
   a gate circuit for transferring, in response to a signal, a voltage corresponding to said write data in said latch circuit to a bit line of said semiconductor memory device;
   wherein said latch circuit comprises,
      a first inverter circuit having a first input node and a first output node,
      a second inverter circuit having a second input node connected to said first output node and a second output node connected to said first input node,
      a first transistor coupled to a power source line,
      a second transistor coupled between said first transistor and said first input node and having a first gate coupled to said data input line,
      a third transistor coupled between said first transistor and said second input node and having a second gate, and
      a third inverter circuit having a third input node coupled to said data input line and having a third output node coupled to said second gate;
   wherein one of said first and second output nodes is coupled to said gate circuit.

2. The write circuit as claimed in claim 1, wherein said signal is a write signal which is activated during a data write cycle.

3. The write circuit as claimed in claim 1, wherein said gate circuit comprises a first channel transistor having a gate which is supplied with said signal, one of a source and a drain of said first channel transistor being connected to said latch circuit and the other of said source and said drain connected to said bit line.

4. The write circuit as claimed in claim 3, wherein said gate circuit further comprises a second channel transistor connected in parallel with said first channel transistor and having a gate which is supplied with the inverse of said signal.

5. A semiconductor memory device comprising:
   first and second memory cells;
   a first bit line coupled to said first memory cell;
   a second bit line coupled to said second memory cell;
   a data line;
   a write circuit including:
      a latch circuit coupled to said data line and a node for latching write data from said data line, and
      a gate transistor having a source terminal coupled to one of said latch circuit and said node, a drain terminal coupled to the other one of said latched circuit of said node, and a control terminal supplied with a control signal;
   a selector coupled to said first and second bit lines and said node, said selector which electrically connects one of said first and second bit lines with said node in response to a select signal; and a bit line reset circuit for resetting the other one of said first and second bit lines in response to said select signal and an inverse signal of said control signal when said one of said first and second bit lines is selected by said selector.

* * * * *

UNITED STATES PATENT AND TRADEMARK OFFICE
CERTIFICATE OF CORRECTION

PATENT NO. : 6,046,941
DATED : April 4, 2000
INVENTOR(S) : Hiroyuki Kobatake

Page 1 of 1

It is certified that error appears in the above-identified patent and that said Letters Patent is hereby corrected as shown below:

Column 7, line 25 delete "32" insert $3_2$--

Signed and Sealed this

Fifth Day of June, 2001

NICHOLAS P. GODICI

*Attest:*

*Attesting Officer*

*Acting Director of the United States Patent and Trademark Office*